United States Patent [19]

Sedding et al.

[11] Patent Number: 5,475,312

[45] Date of Patent: Dec. 12, 1995

[54] METHOD AND DEVICE FOR DISTINGUISHING BETWEEN PARTIAL DISCHARGE AND ELECTRICAL NOISE

[75] Inventors: Howard G. Sedding; Steven R. Campbell, both of Toronto, Canada

[73] Assignee: Iris Power Engineering Inc., Mississauga, Canada

[21] Appl. No.: 255,851

[22] Filed: Jun. 7, 1994

[51] Int. Cl.⁶ .................................................. G01R 31/12
[52] U.S. Cl. ............................ 324/536; 324/772; 361/33
[58] Field of Search .................................... 324/546, 772, 324/536, 520–522; 340/648; 73/116; 364/486; 318/490; 361/33, 111

[56] References Cited

U.S. PATENT DOCUMENTS

| | | | |
|---|---|---|---|
| 3,707,673 | 12/1972 | Carter | 324/52 |
| 3,775,676 | 11/1973 | Harrold et al. | 324/52 |
| 3,887,866 | 6/1975 | Safer et al. | 324/51 |
| 4,238,733 | 12/1980 | Freeman | 324/158 |
| 4,327,334 | 4/1982 | Becavin et al. | 333/1 |
| 4,385,271 | 5/1983 | Kurtz et al. | 324/51 |
| 4,445,057 | 4/1984 | Kuter et al. | 310/68 |
| 4,454,587 | 6/1984 | Kiefer et al. | 364/486 |
| 4,539,499 | 9/1985 | Punch et al. | 310/214 |
| 4,541,070 | 9/1985 | Musin et al. | 364/486 |
| 4,562,549 | 12/1985 | Tanaka et al. | 364/486 |
| 4,779,051 | 10/1988 | Grunewald | 324/536 |
| 4,853,818 | 8/1989 | Emery et al. | 361/33 |
| 4,908,771 | 3/1990 | Piot | 364/486 |
| 4,949,001 | 8/1990 | Campbell | 310/220 |
| 5,047,724 | 9/1991 | Boksiner et al. | 324/520 |
| 5,222,028 | 6/1993 | LaBarre et al. | 364/486 |
| 5,223,795 | 6/1993 | Blades | 324/536 |
| 5,256,977 | 10/1993 | Domenichini et al. | 324/520 |

OTHER PUBLICATIONS

Timperly. "Incipient Fault Identification Through Neutral RF Monitoring of Large Rotating Machines." IEEE Trans. PAS, Mar. 1983, p. 693.

Fuhr et al. "Recognition of Defects in Seriously Aged Stator Insulation of Rotating Machines." IEEE Winter Power Meeting, Feb. 1992, N.Y. IEEE Pub. 92–THO–425–9–PWR.

Primary Examiner—Maura K. Regan
Attorney, Agent, or Firm—Mark B. Eisen

[57] ABSTRACT

A method and device for distinguishing between partial discharge and electrical noise in high voltage conductors such as in motor and generator stators, power cables, gas insulated switchgear and other equipment where high voltage insulation is subject to deterioration. A series of comparators sets a trigger threshold and a voltage range, set by a computer, whereby pulses falling within the voltage range are sampled at four short intervals and then four longer intervals to produce a general pulse width profile. The voltage range is varied by the computer so that a number of voltage ranges are sampled during each selected portion of an ac cycle. The pulse width of pulses falling within each voltage range is recorded by the computer, and displayed graphically. In a preferred embodiment the device is provided with two channels, for receiving a signal from each end of a partial discharge detector described in U.S. Pat. No. 4,949,001. In a preferred embodiment the method and device provide information concerning the polarity, arrival time and width of the measured pulses, which thus enables the operator to distinguish between partial discharge and noise and to detect the general location from which the pulse originated.

17 Claims, 17 Drawing Sheets

METHOD AND DEVICE FOR DISTINGUISHING BETWEEN PARTIAL DISCHARGE AND ELECTRICAL NOISE

FIELD OF INVENTION

This invention relates to partial discharge detection equipment. In particular, this invention relates to a method and device for detecting partial discharge in high voltage electrical insulation and distinguishing between partial discharge pulses and pulses from other sources.

BACKGROUND OF THE INVENTION

A partial discharge is a small electrical spark which is caused by deterioration of the electrical insulation used in high voltage electrical equipment such as motors and generators. The electrical pulses propagated by partial discharges can be used to indicate deteriorating insulation in the stator winding insulation, and to some degree the extent of the deterioration, which will eventually lead to short circuiting and stator winding failure. Thus, through detection of partial discharges motor and generator users can determine whether stator winding failure is imminent, and take corrective action accordingly.

Partial discharges also occur in power cables, gas insulated switchgear, and other equipment where high voltage electrical insulation is subject to deterioration. The partial discharge detector of the present invention can be used to distinguish between partial discharge pulses and pulses from other sources in all such equipment.

There are many methods of measuring partial discharge. Most involve detecting the electrical signals which accompany a partial discharge within deteriorating insulation. Sensors which detect partial discharge signals include capacitors, current transformers and high frequency electromagnetic antennae. Signals from such sensors are displayed in the time domain on an oscilloscope, or in the frequency domain on a frequency spectrum analyzer, and are analyzed by an expert to determine whether the signal does in fact represent a partial discharge.

U.S. Pat. No. 4,949,001 issued Aug. 14, 1990, which is incorporated herein by reference, teaches an instrument, referred to as a "stator slot coupler" ("SCC"), which allows an operator to determine the nature and location of partial discharge within a stator winding with considerably more accuracy than afforded by previous techniques. However, the results still must be interpreted by an experienced operator, because in a typical plant operating motors and generators there is considerable electrical interference (noise) generated by power tools, arcing carbon brushes on slip rings, high voltage switchgear and transformers and switching noise from electronic power supplies, all of which obscure the relatively small partial discharge pulses from the winding. The need for an expert to observe significantly increases the cost of performing such a test, so users tend to test their equipment much less frequently than they should. Ideally motors and generators should be tested for stator winding deterioration at least semiannually, an interval at which any increase in partial discharge activity will be detected before winding failure occurs.

Many types of noise have a frequency content differing significantly from that of a partial discharge pulse, and previous attempts to develop devices which distinguish between partial discharge and noise have relied on filtering techniques which discriminate between differing frequencies. However, some types of noise, such as corona from high voltage switchgear, have essentially the same frequency content as stator winding partial discharge. Thus, filtering is not always a reliable method of eliminating noise.

Another technique is to block the noise signal from reaching the recording instrument, using signals from auxiliary sensors located close to the sources of noise. The equipment is designed to ignore pulses received at the primary sensors if the pulses are close in time to pulses received at the auxiliary sensors, since such pulses are known to be noise, and these pulses are thus not transmitted to the recording instrument. However, in practical applications in an industrial plant it is often not possible to anticipate or locate all noise sources, so the results of partial discharge testing may not be reliable in any particular case.

More recently pattern recognition techniques based on statistical analysis and neural networks have been applied. Pulses are recorded, and displayed in multi-dimensional graphs of number of pulses versus magnitude versus phase position, and post-processing software is used to find patterns associated with noise and partial discharge. These techniques require prior characterization of the noise environment by an expert, and cannot be adapted to changes in the noise environment over time.

Another technique applicable to hydrogenerator stator windings uses a pair of sensors (called PDA couplers) for each phase, installed in specific locations of the stator winding of a particular generator known as a hydrogenerator. Based on the principle that it takes time for partial discharge and noise pulses to propagate through the winding, and that these pulses have a maximum rise time of 5 ns, noise can be distinguished from partial discharge based on the arrival time of a pulse at the PDA couplers. This technique works well for hydrogenerators, having internal phase buses which are often longer than 10 m (which corresponds to a pulse travel time of about 30 ns), allowing time for the electronic circuits to react to differences in pulse travel times, but is inadequate for high speed motors and turbine generators where internal phase buses, if there are any, are often less than 1 m in length.

The "stator slot coupler" described in U.S. Pat. No. 4,949,001 is an electromagnetic sensor specifically designed to detect partial discharge activity in operating turbine generators and motors, where PDA couplers are ineffective. The device has a bandwidth of 1000 MHz and is installed within the stator winding slots. The inventors have determined through the use of the stator slot coupler that partial discharge pulses in the immediate environment of the device are single, unipolar pulses having a pulse width of 8 ns or less, whereas all pulses known to originate as noise have a pulse width of 24 ns or greater.

The stator slot coupler is further designed to provide an output from each end of the device, which has a length of about 50 cm. Since a pulse travels through a stator winding at a specific speed (about 0.15 m/ns), by comparing the relative arrival time of the pulse at each end of the stator slot coupler it is possible to determine the direction of the origin of a partial discharge pulse or whether the pulse originated underneath the device. This allows one to determine whether the partial discharge activity is occurring within the stator slot or in the endwinding (outside of the stator slot), and corrective procedures for the stator winding can be designed accordingly. The different arrival times similarly permit a determination of the location of partial discharge in power cables and gas-insulated switchgear.

Previously the preferred instrument for observing the pulses detected by a stator slot coupler was a 1 GHz sample rate or faster, dual channel oscilloscope. However, since there are thousands of partial discharge and noise pulses occurring every second, and commercially available oscilloscopes can only record and display about 10 pulses per second, only a small proportion of such pulses are captured and a considerable amount of information is thus lost.

An instrument capable of separating noise from partial discharge based on the shape (i.e. width) of the pulses, which is also capable of determining the location of the source of the pulse based on the relative arrival time of pulses at each end of the stator slot coupler, cannot use conventional electronic circuitry for a number of reasons. First, the duration of some pulses is extremely small; pulses may be as short as 2 ns. Very fast electronic circuitry would be required to capture the width of such short pulses, and to determine at which end of the sensor the pulses arrived first, when the time difference between sensing of the pulse at each end of the sensor can be as short as 2 ns.

It is desirable to capture and store the width of each pulse because the physics of the partial discharge process suggests that there is probably a correlation between the width of the pulse and the nature of the deterioration. For example, delamination partial discharge may tend to produce pulses of relatively greater width. Moreover, because high frequency pulses attenuate quickly in stator windings and the like, by the time such pulses reach the sensor they may be considerably wider than when initially produced. Thus, it is desirable to be able to measure a range of pulse widths, as opposed to merely distinguishing between pulses less than 8 ns and those greater than 24 ns. It is also desirable to be able to change the characterization of noise and partial discharge pulses, for example to define a partial discharge pulse as having a width of less than 4 ns rather than 8 ns, to accommodate new research findings on the correlation of pulse width with winding deterioration, without any major change in electronic circuitry.

To accomplish all of this requires extremely fast circuitry and many different types of conditions must be decoded. It is not economically feasible to use cryogenic or superconducting electronic components, so conventional components must be used. Moreover, the flash analog-to-digital converters used in digital oscilloscopes which capture the entire waveform of a pulse would result in most partial discharge pulses being ignored since the time required to capture, store and display the pulse shape in a computer would be many milliseconds, whereas the time between partial discharge pulses can be infinitesimal.

The present invention overcomes these disadvantages by providing a method and device for distinguishing between partial discharge pulses and noise pulses. The invention employs comparators to establish upper and lower dc voltage thresholds defining a range of voltages, and produce a digital output depending upon the magnitude of the pulse. The invention uses varying time sampling to measure the pulse magnitude at short and then relatively longer intervals, which significantly reduces decoding and memory requirements. All pulses are sampled and characterized by pulse width, polarity and arrival time, and this information is stored and sorted conventionally to provide a pulse profile, in real time, for signals detected by the sensor. Decoding in real time ensures that, over time, no partial discharge pulse shapes go undetected.

Moreover, the invention accomplishes this using conventional electronic circuitry. By separating the operations of decoding pulse shape and decoding polarity/arrival time/magnitude, relatively inexpensive integrated circuits can be used in the device of the invention. Decoding the pulse type as a function of time allows flexibility in the definition of partial discharge; thus, in other applications (for example analyzing partial discharge in gas insulated switchgear) where partial discharge pulses may be known to have a shorter pulse width, the definition can be easily changed to accommodate the specific application. The invention can be utilized with any partial discharge sensor capable of receiving wide-band pulses.

SUMMARY OF THE INVENTION

The present invention thus provides a device for distinguishing between partial discharge and electrical noise received by a sensor, comprising a sensor input for connection to the sensor, pulse height analyzer means connected to the sensor input for determining whether an amplitude of a pulse detected by the sensor is within a preselected range of voltages, trigger means having an input connected to the sensor input and an input provided with a reference voltage that is lower than the range of voltages, for transmitting an output when the amplitude of the pulse detected by the sensor is above the reference voltage, a controller including a clock activated by a pulse having a voltage within the range of voltages, for sampling the output of the trigger means at a series of preselected intervals, first recording means for recording the output of the trigger means at the preselected intervals, second recording means for recording information from the first recording means when the pulse has an amplitude within the range of voltages, means for decoding the information stored in the second recording means including programmable means programmed with parameters defining pulse types corresponding to predetermined parameters for partial discharge pulses and noise pulses, and means for recording each occurrence of pulses of the defined pulse types.

The present invention further provides a device for distinguishing between partial discharge and electrical noise received by a sensor having two outputs for transmitting a signal proportional to an amplitude of a pulse received by the sensor, the sensor being directional such that the location of the pulse relative to the sensor determines the timing of transmission of the signal from each sensor output, comprising a sensor input for connection to each output of the sensor, pulse height analyzer means connected to at least one sensor input for determining whether an amplitude of a pulse detected by the sensor is within a preselected range of voltages, for each sensor input, trigger means having an input connected to the sensor input and an input provided with a reference voltage that is lower than the range of voltages, for transmitting an output when the amplitude of the pulse detected by the sensor is above the reference voltage, clock means activated by a pulse having a voltage within the range of voltages, for sampling the output of the trigger means at a series of preselected intervals, for each sensor input, a fast shift register for recording the output of the trigger means at the preselected intervals, for each sensor input, a slow shift register for receiving information from the fast shift register where the pulse has an amplitude within the range of voltages, means for decoding the information stored in the slow shift registers including programmable means programmed with parameters defining pulse types corresponding to predetermined parameters for partial discharge pulses and noise pulses, and means for recording each occurrence of pulses of the pulse types.

The present invention further provides a method of distinguishing between partial discharge pulses and noise pulses in a high voltage conductor, including the steps of providing trigger means with a reference voltage and a signal from a pulse, to determine whether the pulse exceeds the reference voltage, sampling an output of the trigger means at a series of preselected intervals to determine a width of the pulse, storing the sampled outputs of the trigger means in a first storage means, determining whether an amplitude of the pulse is within a selected range of voltages, storing the contents of the first storage means in a second storage means if the amplitude of the pulse is within the range of voltages, and comparing the contents of the second storage means with predetermined values to determine whether the width of the pulse is within a predetermined range of pulse widths defining partial discharge.

BRIEF DESCRIPTION OF THE DRAWINGS

In drawings which illustrate by way of example only a preferred embodiment of the invention.

DETAILED DESCRIPTION OF THE INVENTION

Figure 1:
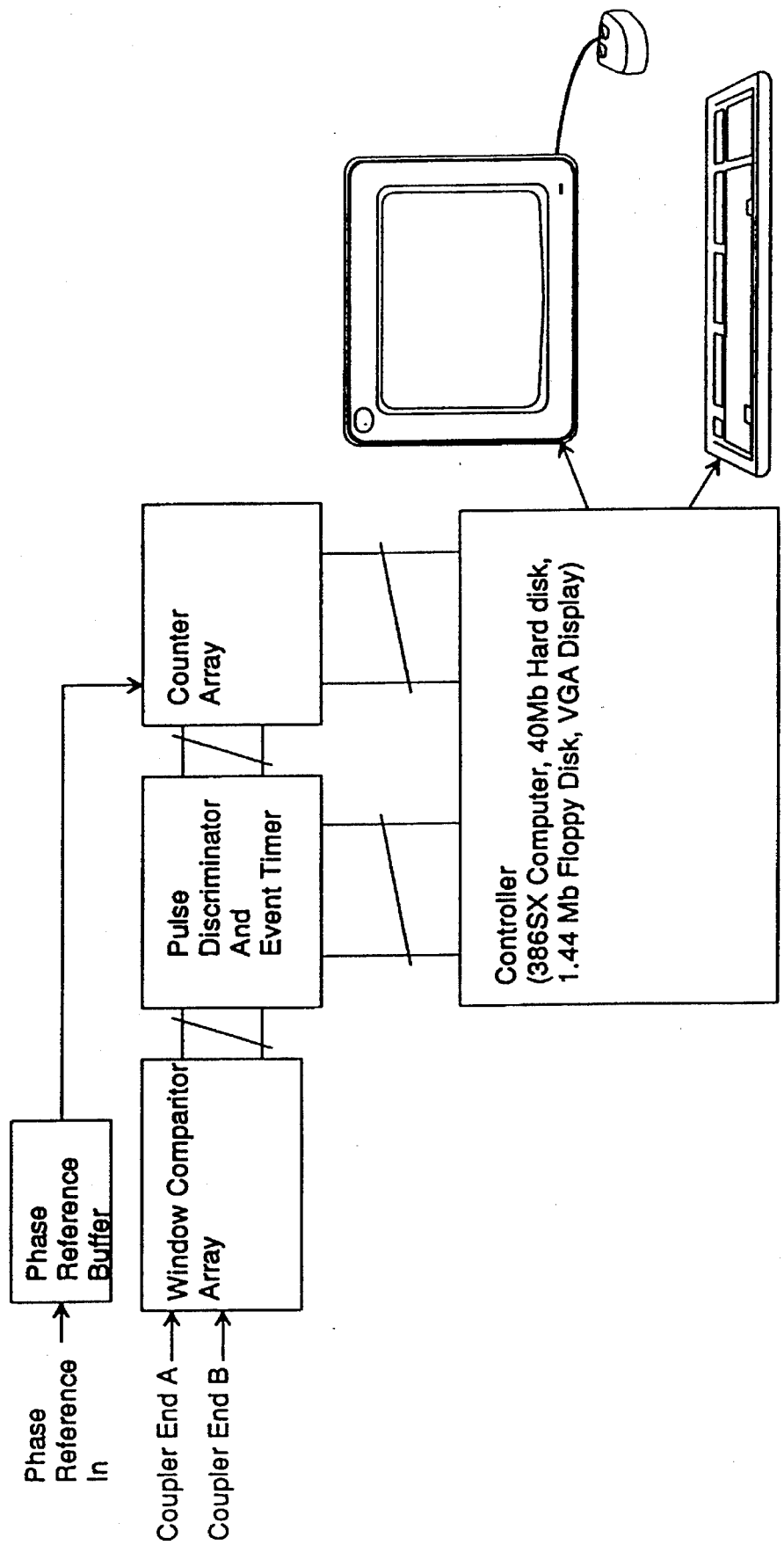
FIG. 1 is a block diagram illustrating the components of the invention.

The main components of the apparatus of the invention are illustrated in FIG. 1. A standard personal computer 2 selects the desired voltage range of pulses to be analyzed at any particular time, as described below, and samples pulses falling within the range at the preset intervals. The computer further records data generated by the apparatus and can be programmed to display the data graphically for the user.

Figure 2:
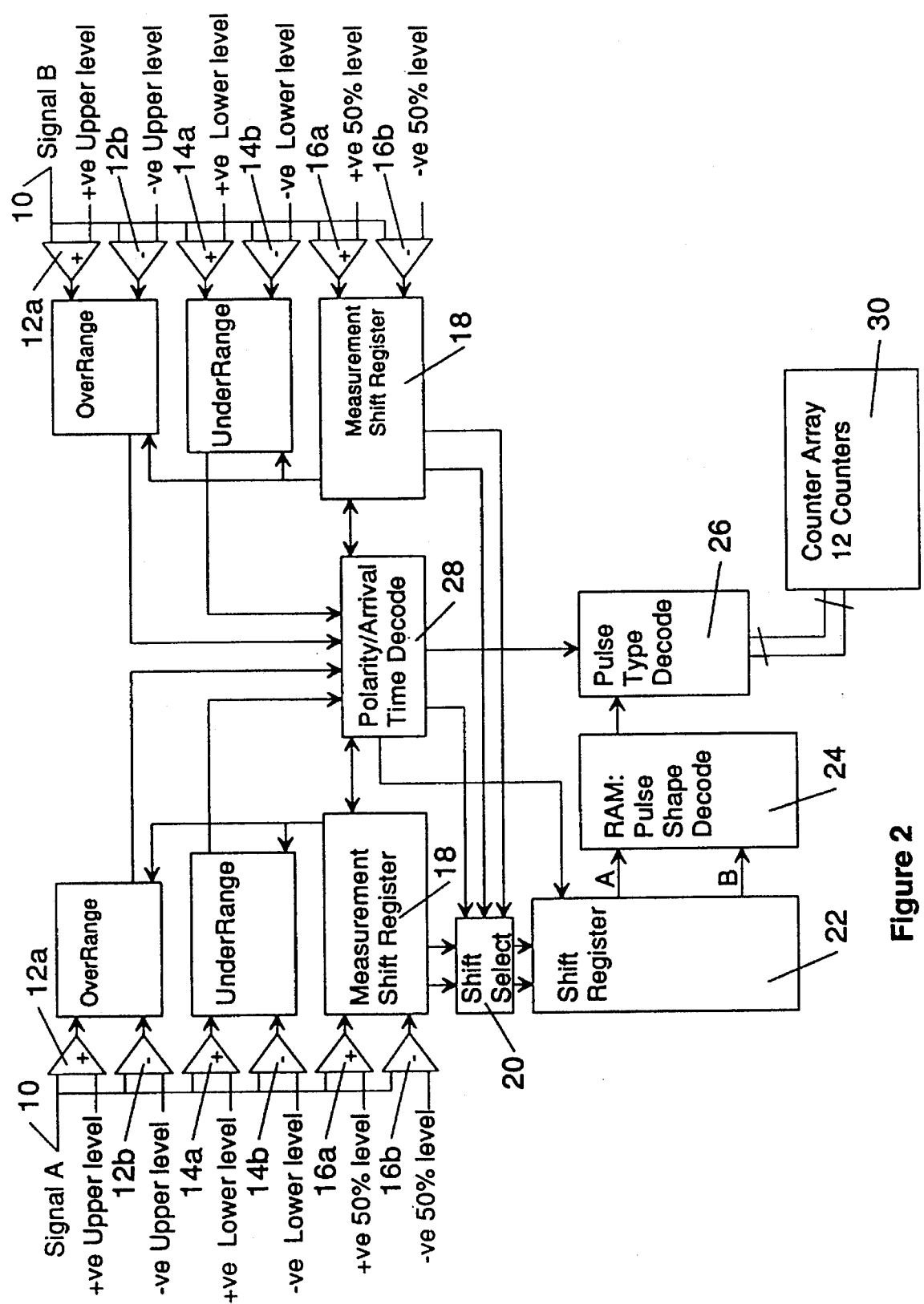
FIG. 2 is a block diagram illustrating the circuitry utilized in the invention of FIG. 1.

The electronic circuitry of a preferred embodiment of the apparatus of the invention is illustrated in the block diagram of FIG. 2. The outputs of a sensor, preferably the stator slot coupler (SSC) described in U.S. Pat. No. 4,949,001, are connected to signal input channels 10 of the device.

In the embodiment illustrated the device is provided with two signal input channels 10, referred to herein as channel A and channel B, one channel for receiving a signal from each end of the SSC. It will be appreciated that the method and device of the invention can be used with other types of partial discharge detectors which output a single signal having an amplitude proportional to the amplitude of the sensed pulse, in which case only a single channel (signal input 10) will be required.

In the embodiment illustrated, for each channel A and B the signal input 10 is connected to the inputs of six high speed comparators, three comparators 12a,14a,16a having a positive dc reference voltage and the other three comparators 12b,14b,16b having a negative dc reference voltage.

First and second comparators 12a,14a for each channel constitute pulse height analyzer means for positive pulses, and first and second comparators 12b,14b for each channel constitute pulse height analyzer means for negative pulses. The comparators 12a,14a (or 12b,14b) are respectively provided with a reference voltage corresponding to the maximum and minimum voltages of a range of voltages defining a specific pulse type. Only pulses having a peak amplitude within the selected voltage range, which varies as described below, are analyzed further to determine pulse type.

Trigger means comprises a third pair of "trigger" positive and negative comparators 16a and 16b, respectively, each provided with a dc reference voltage (the "trigger" voltage) lower than the range of voltages defined by the pulse height analyzers, preferably 50% of the lower voltage limit defined by the second comparators 14a,14b. The trigger comparator 16a or 16b is instructed by the controller 2 using conventional logic to determine at a series of preset intervals, governed by clock pulses, whether the input signal is above or below the reference voltage.

Preferably the trigger comparator 16a or 16b (depending upon whether the input signal is positive or negative) is sampled at four intervals of 2 ns and then at four intervals of 8 ns. The output of the trigger comparator 16a or 16b is sampled at 0, 2, 4, 6, 8, 16, 24, 32 and 40 ns, producing 9 bits which are serially fed into first recording means comprising a 9 bit fast shift register 18. The reason for enlarging the sampling interval for the last four samples will be explained below.

In the embodiment illustrated, first recording means for recording the outputs of the trigger means comprises four fast shift registers 18: one positive and one negative for each channel A and B. The fast shift registers 18 are made from ECL components and have a delay time less than 1 ns. The outputs of the fast shift registers 18 are all fed through a shift select decoder 20, which uses conventional high speed logic to determine whether the detected pulse is positive or negative.

For each channel A and B, once the polarity of the first detected signal (i.e. the signal with the earliest arrival time as between channel A and channel B) has been determined, and providing that the pulse height analyzer has determined that the detected pulse is within the predetermined range of voltages, the contents of the fast shift registers 18 of that polarity only are transferred to second recording means comprising a slow (CMOS logic) shift register 22.

For example, if a positive pulse that exceeds the trigger voltage is received by the trigger comparators 16a and 16b, the signal input of comparator 16a goes high and will stay high until the amplitude of the pulse has dropped below the trigger voltage. The output of the comparator 16a for each channel is sampled at the aforesaid intervals, and this information is fed into the fast shift registers 18. If the amplitude of the pulse is not within the range of voltages defined by the comparators 12a and 14a, none of the information received by the fast shift registers 18 is transferred to the slow shift registers 22, and sampling continues with the next pulse exceeding the trigger voltage. If the pulse amplitude is within the voltage range as set for that sample interval, only the contents of the positive fast shift registers 18 is transferred to the slow shift registers 22; all information received by the negative fast shift registers 18 over the sampling period is ignored until after the output of the trigger comparator 16a has gone low again. In order to avoid recording after-echos or oscillations of the received pulse as separate, subsequent pulses, there is a short delay (about 2 µs) before the trigger comparator 16a is enabled again.

The 9 bits recorded in the slow shift registers 2 for each channel A and B are then analyzed. In the two-channel embodiment illustrated, the first bit (i.e. bit 0) recorded in the slow shift register 22 associated with the channel A or B that was first triggered by the pulse is always high, and is used to define the start of the pulse analysis procedure. For example, if the signal is first received by channel A, bit 0 of the channel A slow shift register 22 is high and bit 0 of the channel B slow shift register is low (because the first clock pulse, initiated by the channel A trigger comparator, sampled the state of the channel B trigger comparator before the partial discharge pulse reached the channel B side of the stator slot coupler).

The last 8 bits from the channel A and channel B slow shift registers 22 are analyzed by pulse type decoding means including a RAM pulse shape decoder 24, to determine to which of the following four pulse types the pulse belongs:

1. Partial discharge from one end of the sensor or the other, determined by the channel A or B being triggered at least 2 ns before the other channel (this condition will be true even if the other channel is not triggered at all). With bit 0 in the fast shift register 18 high, the pulse will be distinguished as a partial discharge pulse if any of the next four bits 1,2,3 or 4 are low, indicating a pulse width less than or equal to 8 ns.

2. Partial discharge occurring beneath the sensor, determined by both channels A and B going high within a 2 ns interval. This will occur if bit 0 of one channel is high and either bit 0 or bit 1 of the other channel in the same polarity is high (although the fast shift registers 18 have a relatively fast response time, there is a slight delay or "jitter" which may result in such pulses triggering both polarities at the same time even if the pulse is not directly under the center of the sensor). Again, to qualify as partial discharge at least one of bits 1,2,3 or 4 must then be low to define a pulse width of 8 ns or less.

3. "Wide" pulses, recorded for research interest only, which are defined as any pulse having a pulse width between 8 and 24 ns. These pulses are distinguished when bits 1,2,3,4 and 5 are high, but bit 7 is low. (In theory such "wide" pulses should not occur, but for research purposes it may be prudent to record their occurrence since they may reflect a rare form of stator winding partial discharge.) A pulse is only placed in this category if it is detected at one channel before the other; since such pulses are wider than the electrical length of the sensor they cannot occur "underneath" the sensor.

4. Noise, distinguished by any pulse longer than 24 ns. In this case at least bits 1,2,3,4,5,6 and 7 are high. This category includes all pulses within the selected voltage range that do not fall into any of the previous categories.

Figure 3:
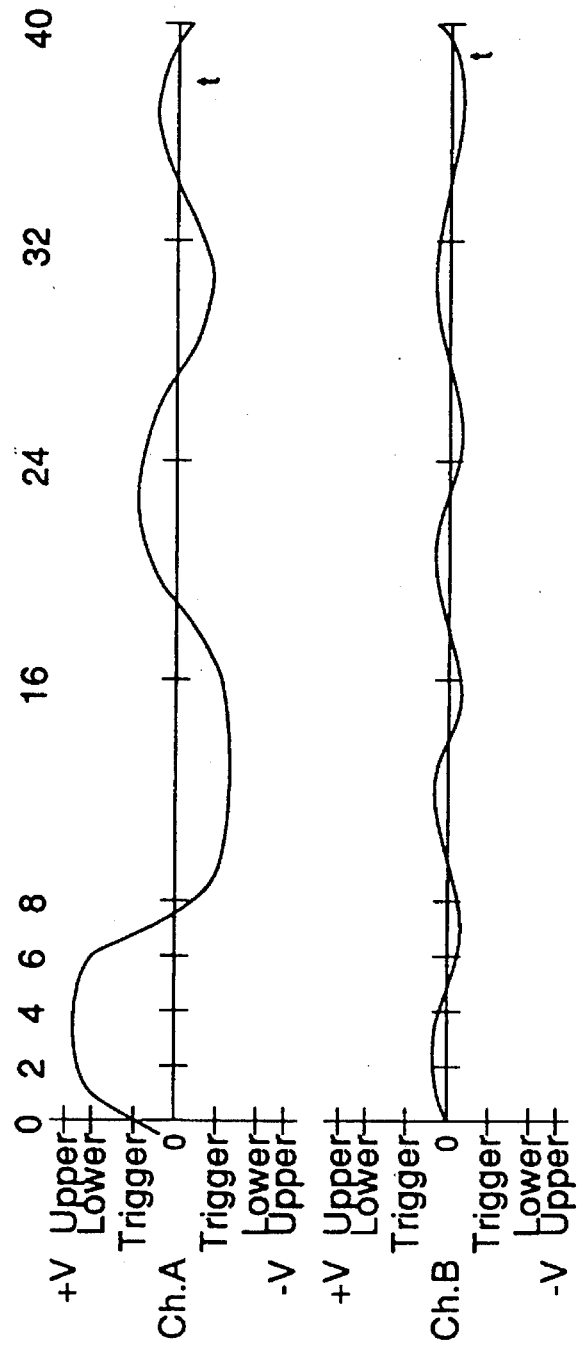
FIG. 3 is a graph showing an example the pulse amplitude for each channel as a function of time.
Figure 4:
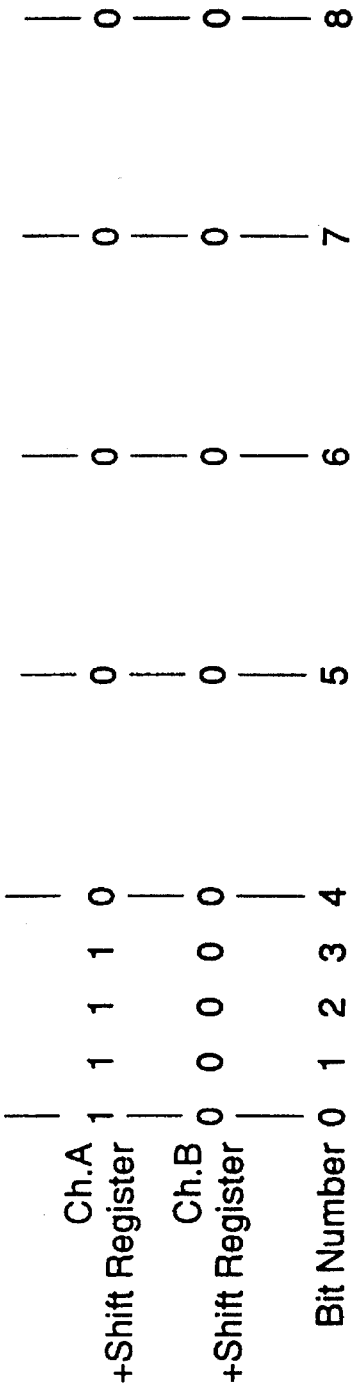
FIG. 4 is a chart illustrating the output of each fast shift register for the pulse of FIG. 2.

FIG. 3 illustrates by way of example a sample waveform showing the amplitude of the detected pulse as a function of time. In this example the pulse originates remotely from the sensor, in the direction of channel A. FIG. 4 illustrates the contents of the slow shift registers 22 corresponding to the pulse illustrated in FIG. 3. From FIG. 4 it can be seen that the pulse was first received at the channel A input 10 (channel A bit 0 is high), and that the pulse is a partial discharge pulse, having a pulse width of between 6 and 8 ns. The pulse will be determined to be positive by the PAT decoder 26, so the information recorded in the slow shift registers 22 reflects only the information stored in the positive fast shift registers 18.

The pulse shape decoder 24 is a 64×4 bit random access memory integrated circuit. The two sets of 8 bit lines from channel A and channel B in the slow shift register are the address for the RAM. Two bits of the RAM are used for the situation where channel A receives the first signal from a pulse (channel A bit 0 is high), and two other bits are used where channel B receives the first signal from a pulse (channel B bit 0 is high). The outputs of the RAM are coded in a conventional manner to designate one of the four pulse types referred to above.

It can thus be seen that, according to the invention, relatively little memory is required to characterize each pulse received by the sensor. If all information received by the fast shift registers 18 for both polarities were recorded, a $2^{32}$ bit RAM would be required to store all of the relevant information, whereas the invention operates effectively with only a 64 k ($2^{16}$) RAM. Moreover, by increasing the clock pulse interval after the first four samples, the method of the invention further reduces the amount of memory required to store pulse data over a period as long as 40 ns while still providing the temporal resolution required to effectively distinguish partial discharge pulses from noise. Using a RAM to define the four basic pulse types allows the definition of pulse types to be altered easily, without any changes in hardware.

The contents of the slow shift registers 22 select the output of the RAM corresponding to one of the four pulse types described above. Four bits of the RAM are used to define the pulse type, two bits defining the pulse type if channel A was first to receive a signal from the pulse, and the other two bits defining the pulse type if channel B was the first to receive a signal from the pulse. These two bits are fed to the pulse type decoding means 26, a standard programmable logic device which categorizes the pulse as one of the four pulse types, which can be briefly described as:

1. Partial discharge pulse triggering one channel before the other;

2. Partial discharge pulse triggering both channels simultaneously (direction cannot be determined);

3. "Wide" pulse (8 to 24 ns); or

4. Noise (over 24 ns).

Additional logic is used to define the polarity of the pulse being analyzed based on the status of bit 0 in the fast shift registers 18, and, if the pulse has been defined as partial discharge triggering one channel before the other (type 1), the direction from which the pulse originated, which determines the general location of partial discharge in the stator winding. Thus, pulses of type 1 can be further categorized as follows:

1. Positive pulse first detected at channel A;

2. Negative pulse first detected at channel A;

3. Positive pulse first detected at channel B; and

4. Negative pulse first detected at channel B.

This information is sorted in conventional fashion by another standard programmable logic device, the polarity/arrival time decoding means (PAT) 28.

The pulse type decoding means 26 records the four bits from the RAM pulse shape decoder 24 and the four bits from the PAT decoder 28, and selects one of twelve pulse counters in a conventional counter array 30 corresponding to the following pulse shape, polarity and arrival time information:

1. Positive partial discharge in the endwinding;
2. Negative partial discharge in the endwinding;
3. Positive partial discharge in the stator slot;
4. Negative partial discharge in the stator slot;
5. Positive partial discharge occurring under the sensor;
6. Negative partial discharge occurring under the sensor;
7. Positive A channel "wide" pulses;
8. Negative A channel "wide" pulses;
9. Positive B channel "wide" pulses;
10. Negative B channel "wide" pulses;
11. Positive or negative noise pulses (over 24 ns); and
12. Pulses outside the voltage range.

Figure 5:
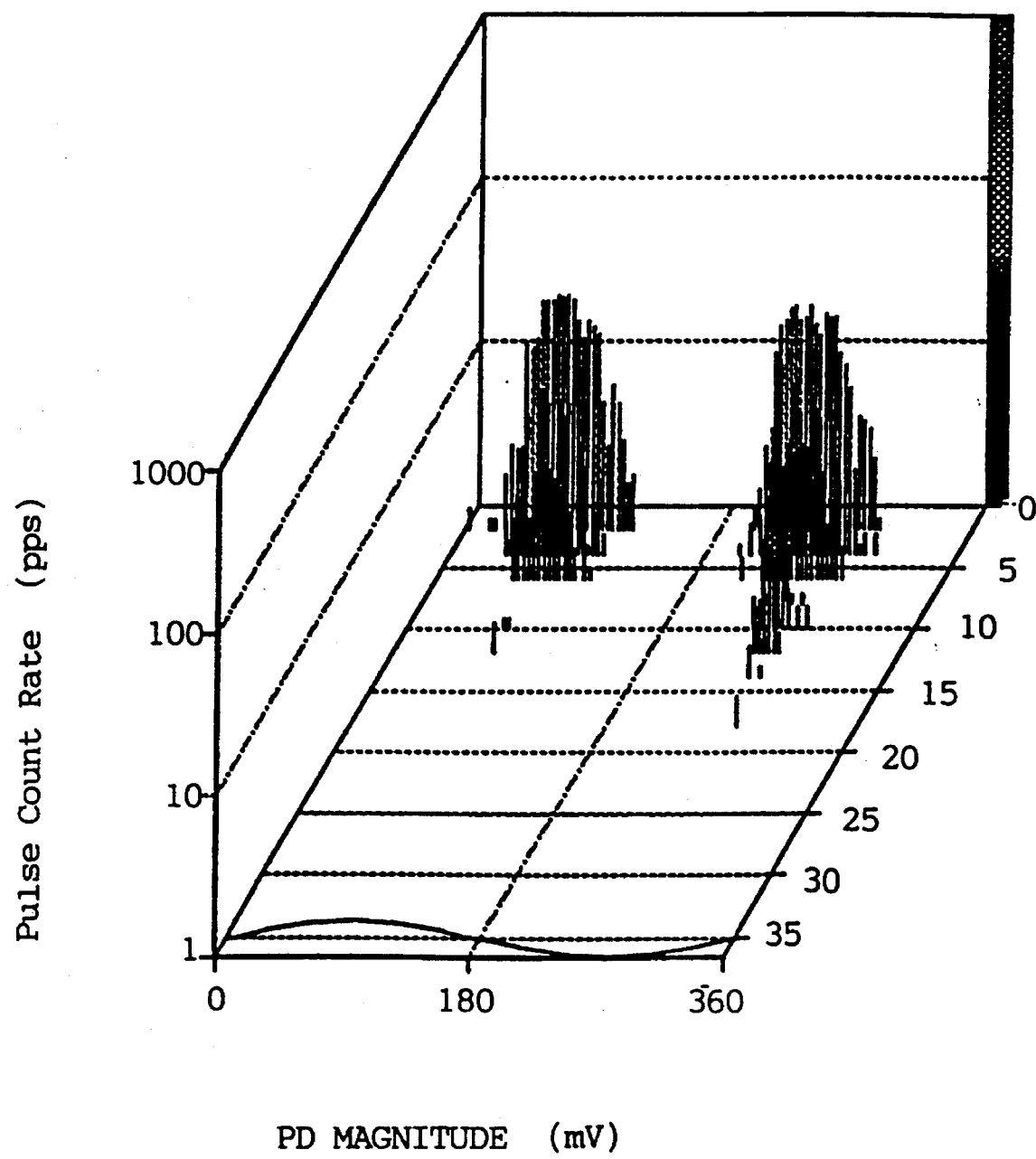
FIG. 5 is a three dimensional graph illustrating the pulse count rate (in pulses per second) as a function of phase angle of the ac signal and magnitude of the partial discharge pulses recorded.
Figure 6:
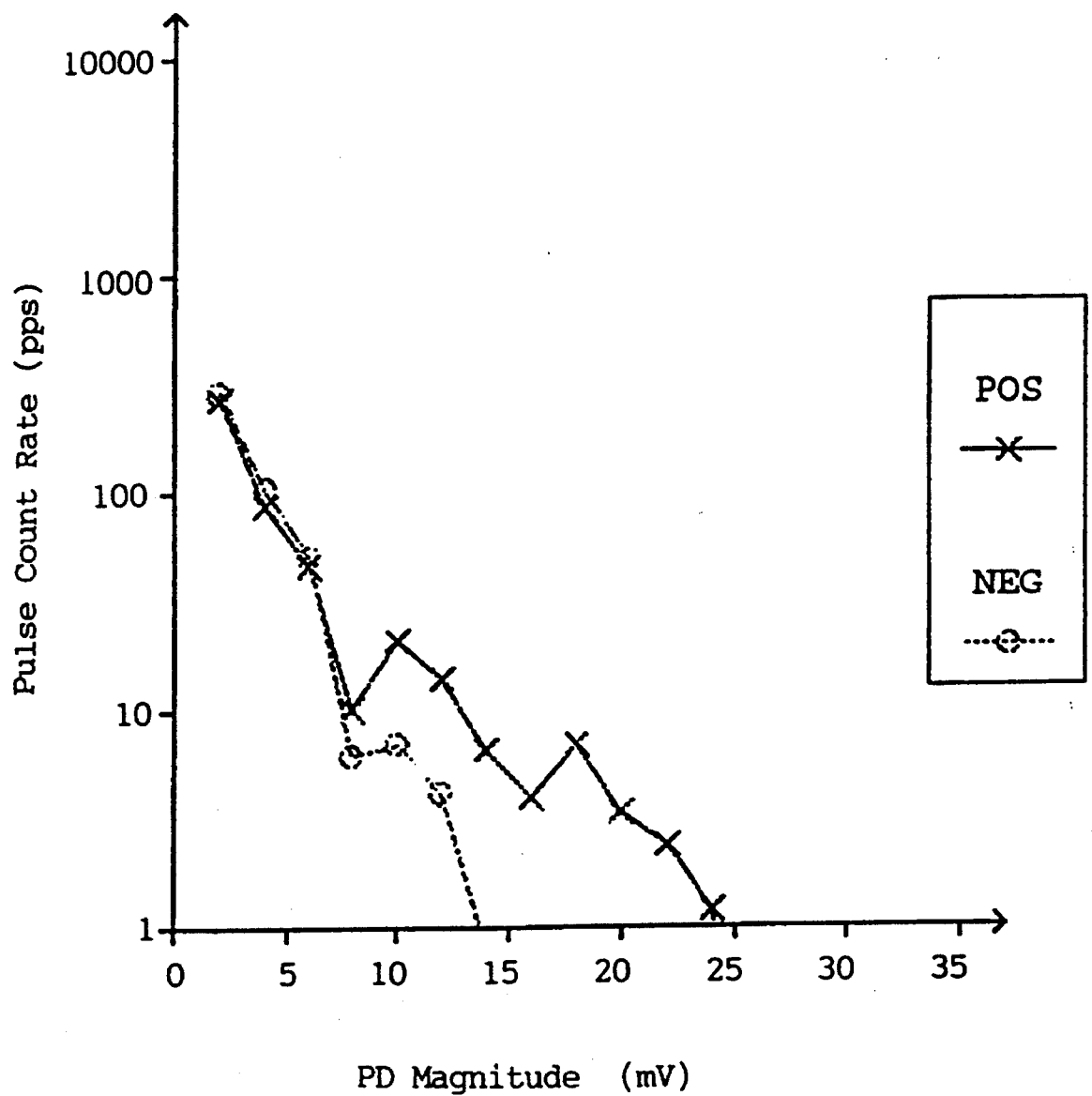
FIG. 6 is a graph illustrating the pulse count rate as a function of the pulse magnitude.
Figure 7A:
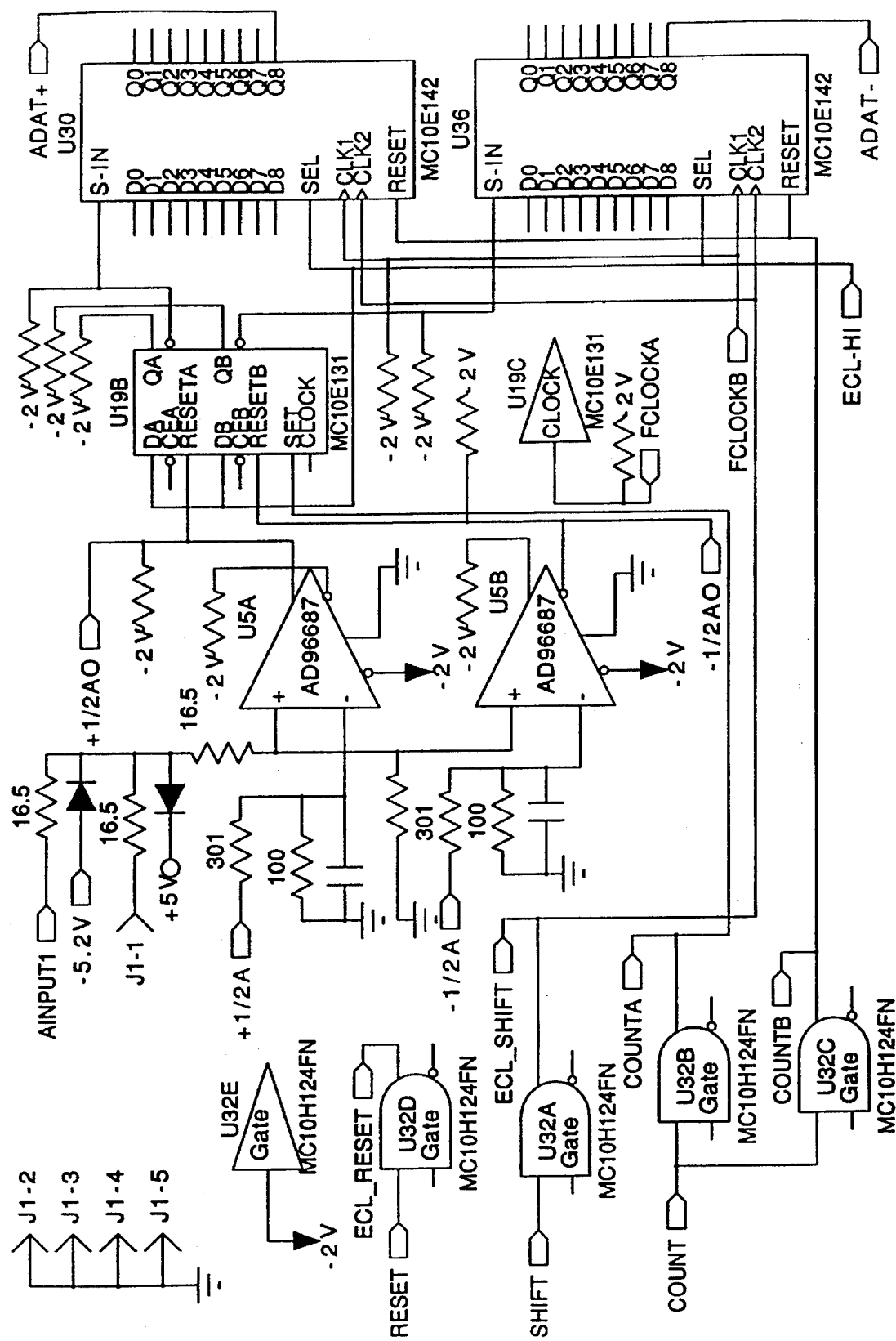
FIGS. 7i aand 7b is a schematic diagram illustrating the trigger comparators and fast shift registers.
Figure 7B:
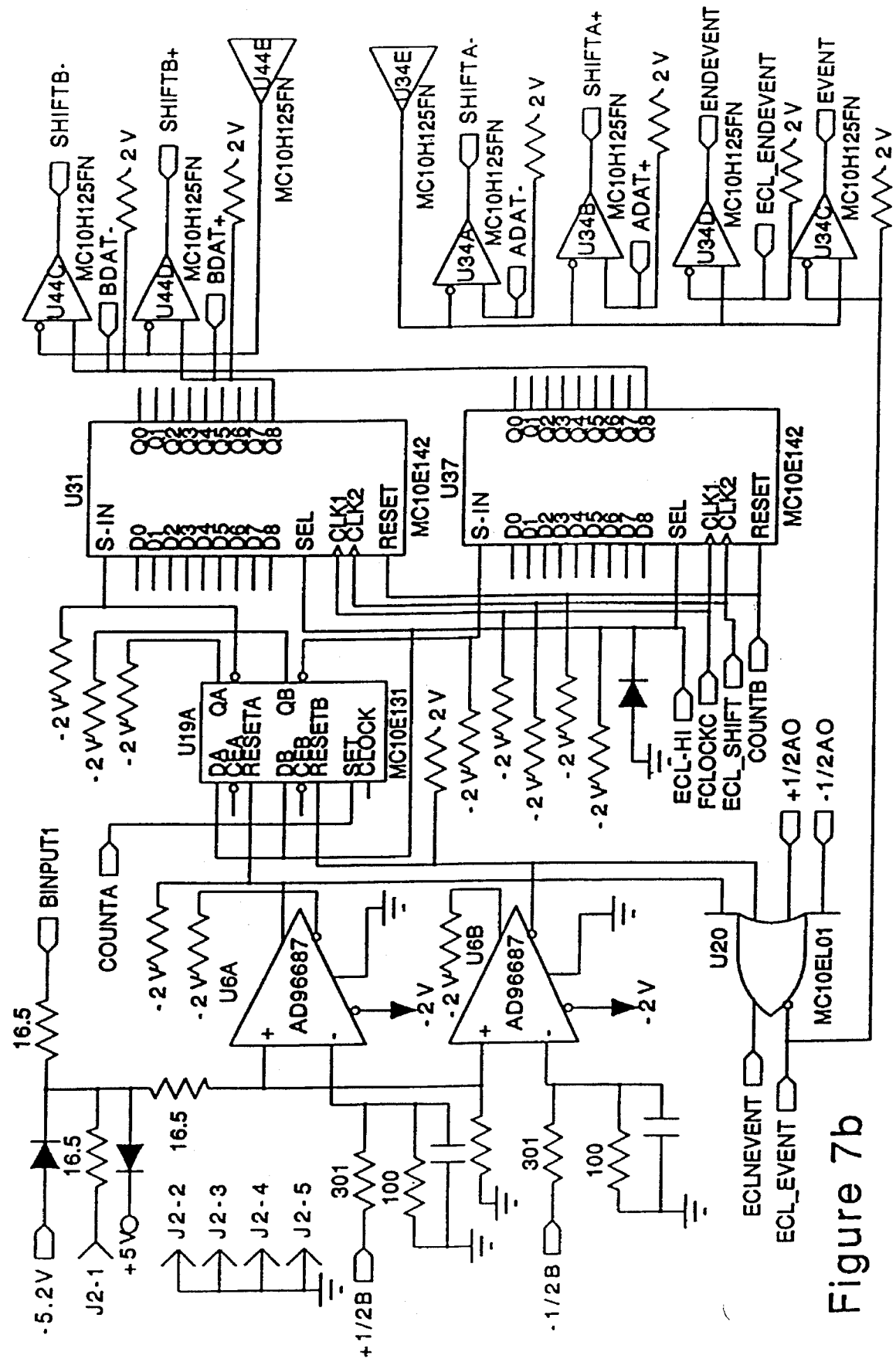
Figure 8A:
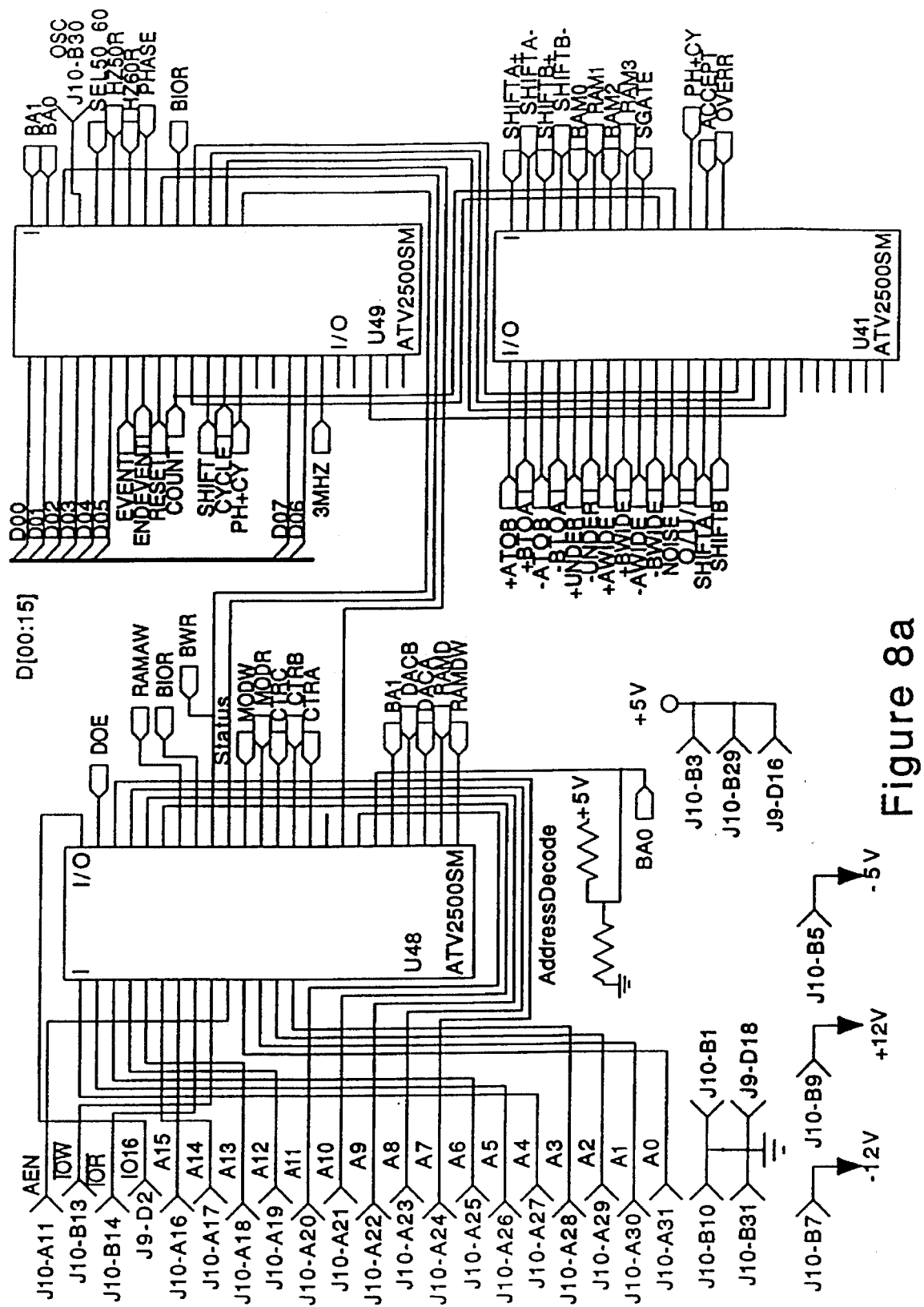
FIGS. 8a and 8b is a schematic diagram illustrating the counter array and pulse type decoding means.
Figure 8B:
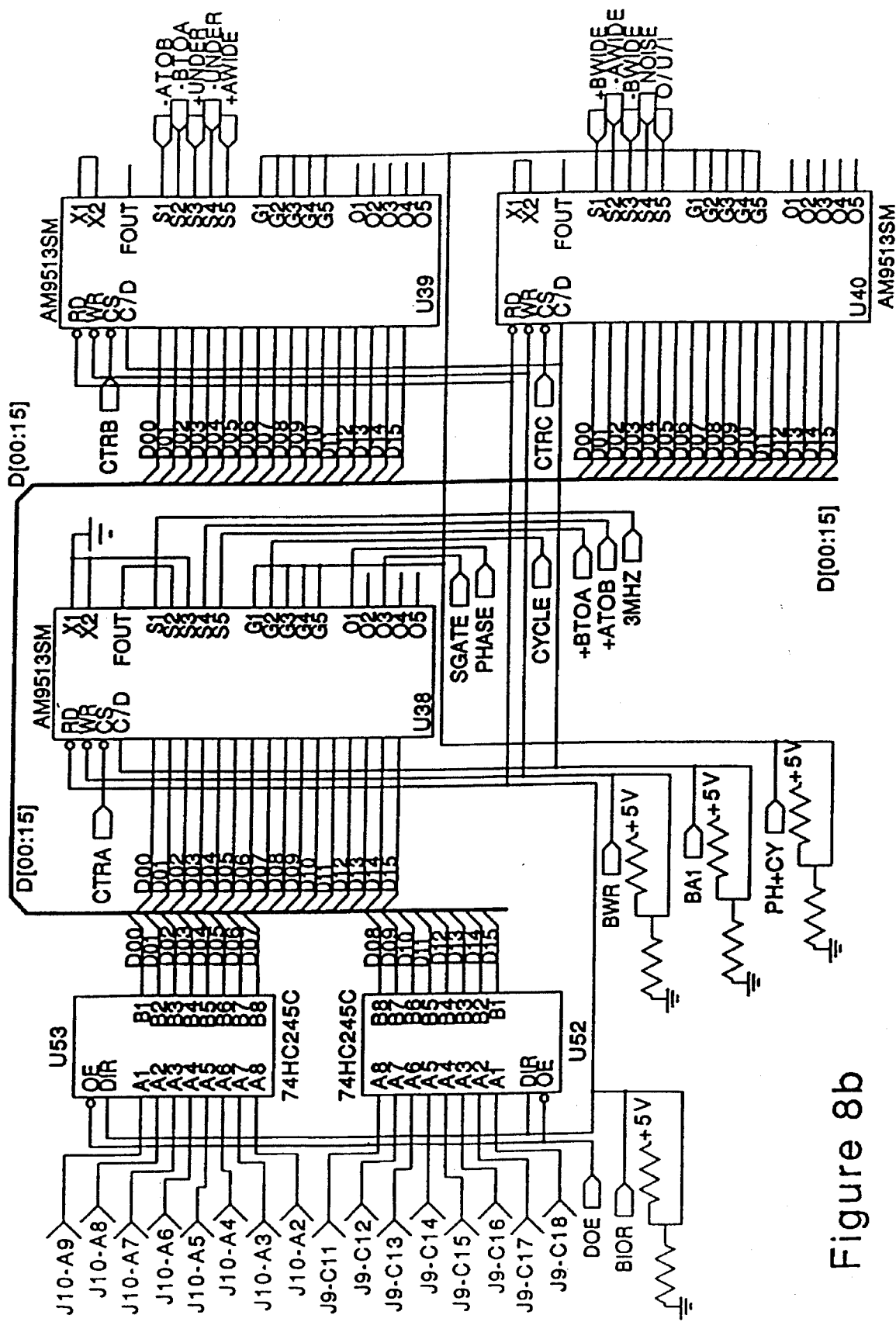
Figure 9:
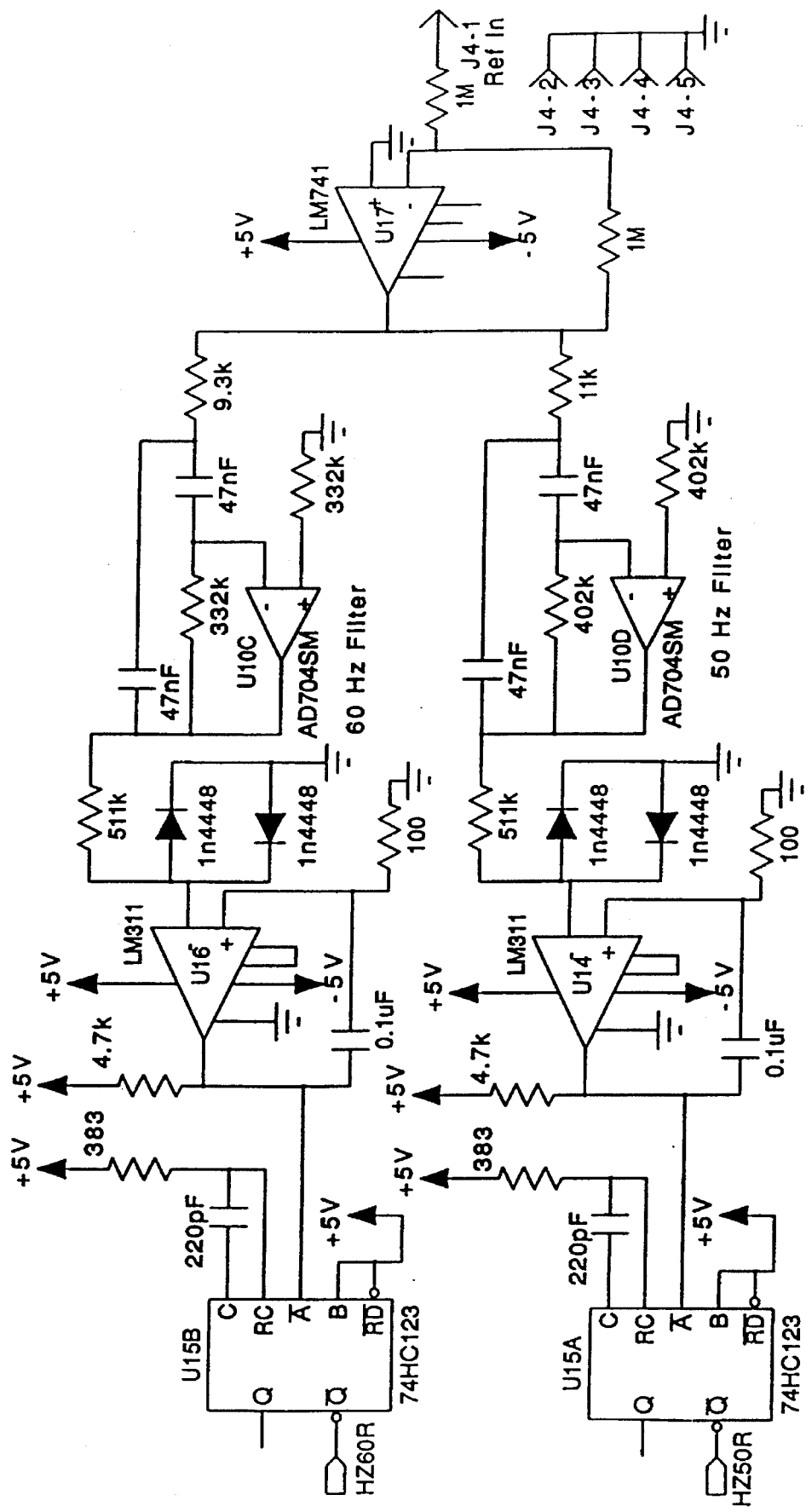
FIG. 9 is a schematic diagram illustrating the phase reference filters.
Figure 10:
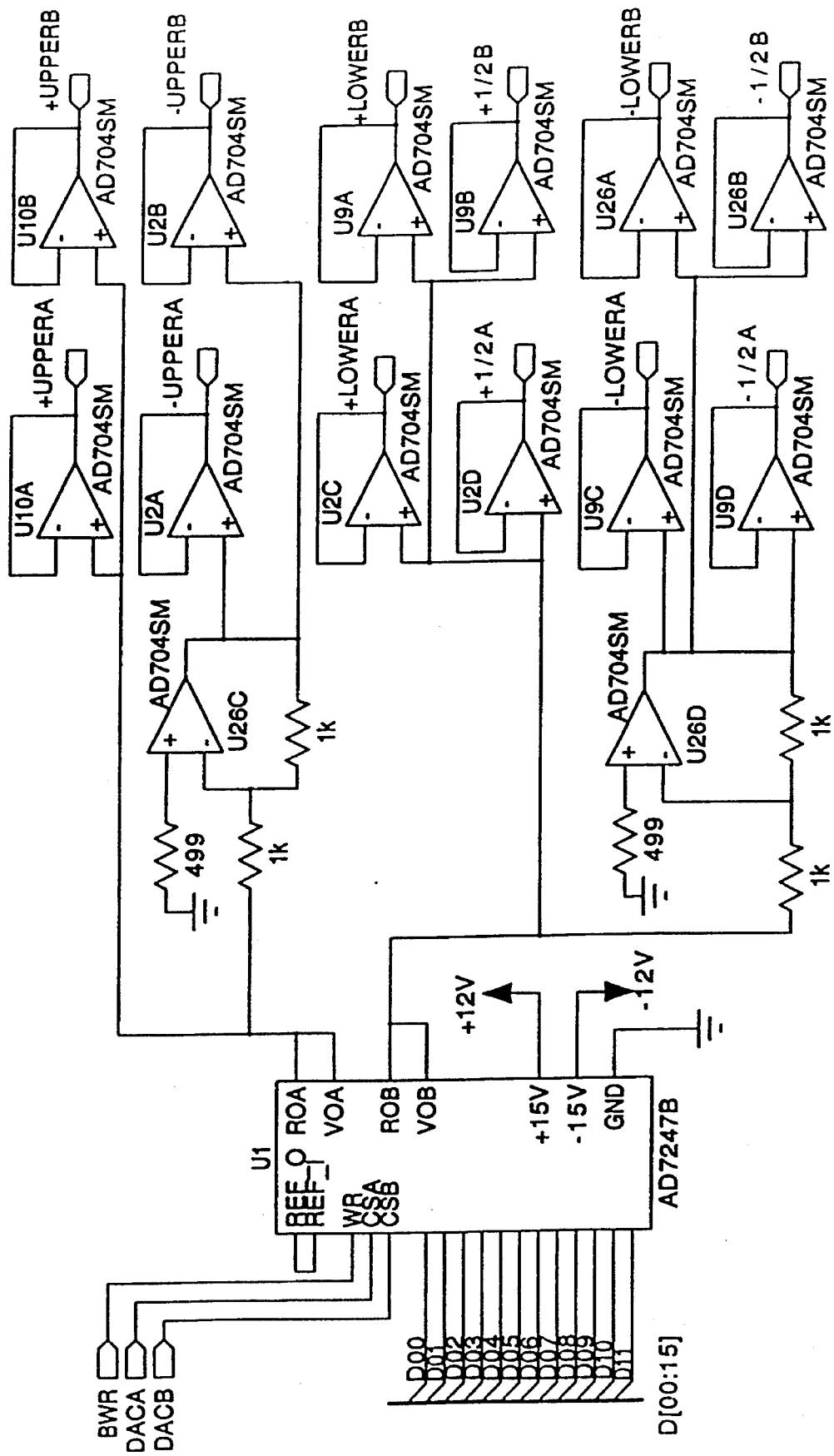
FIG. 10 is a schematic diagram illustrating the pulse magnitude level generator.
Figure 11:
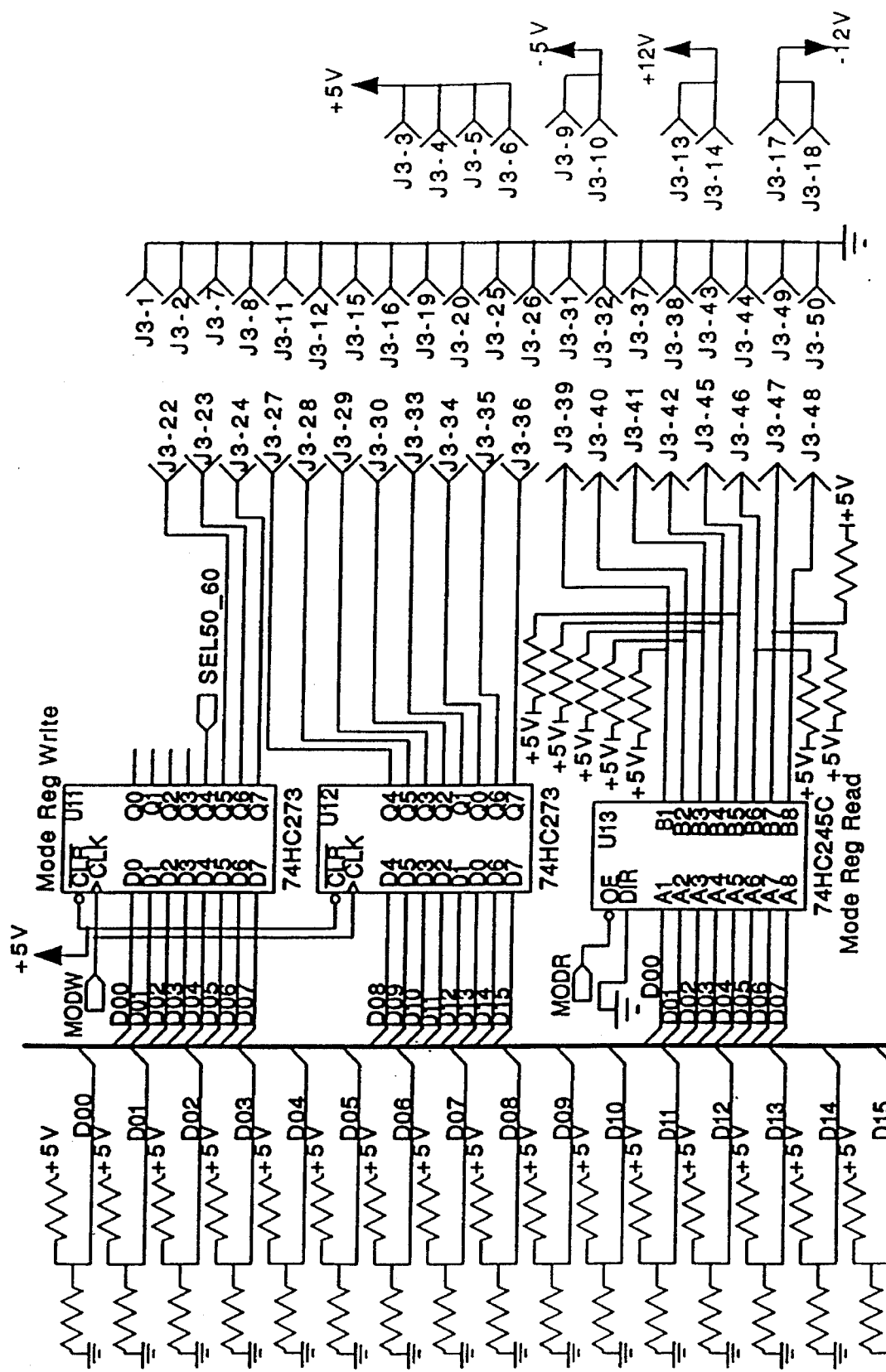
FIG. 11 is a schematic diagram illustrating the mode register.
Figure 12:
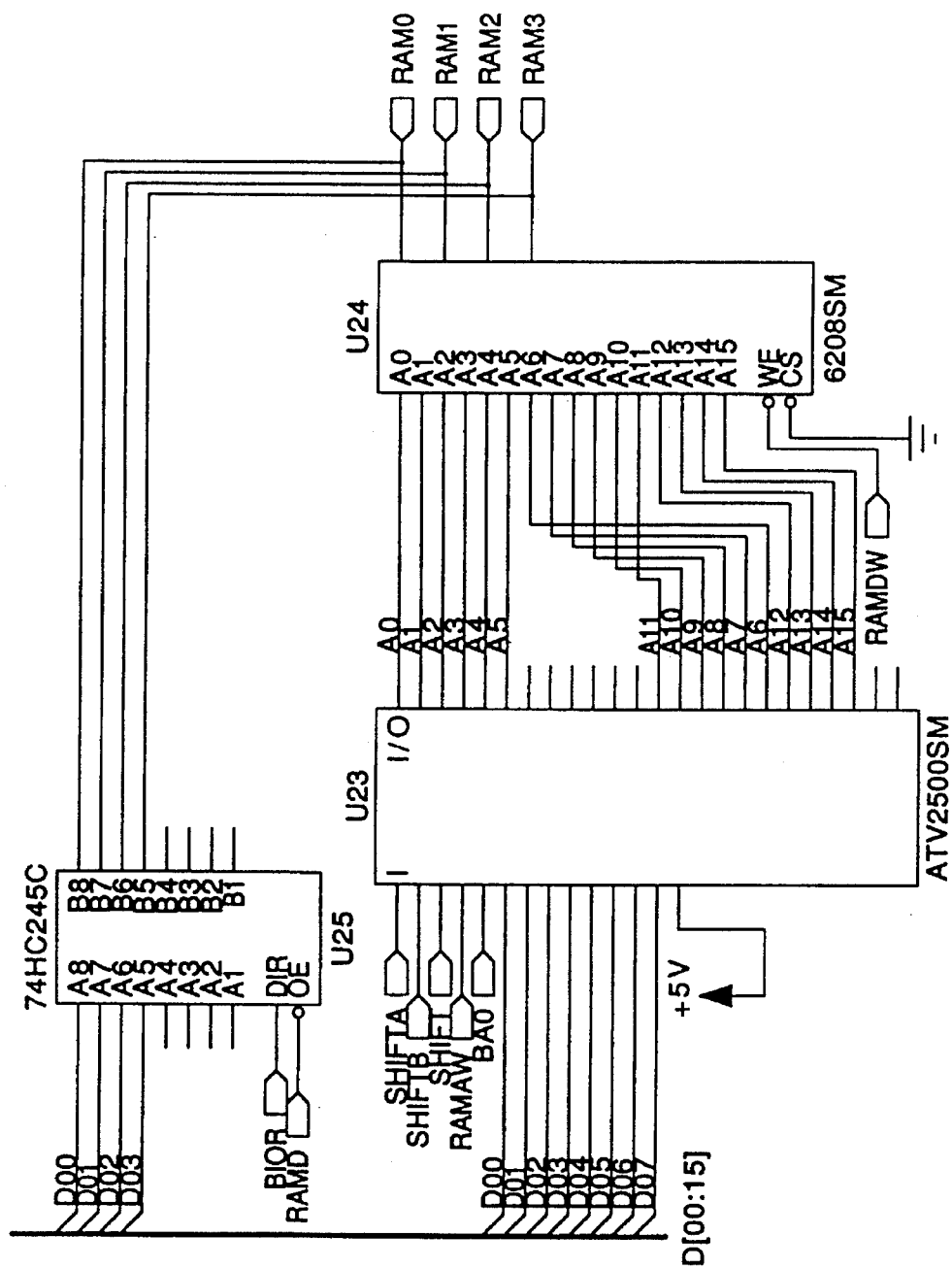
FIG. 12 is a schematic diagram illustrating the slow shift register and RAM pulse decoder.
Figure 13:
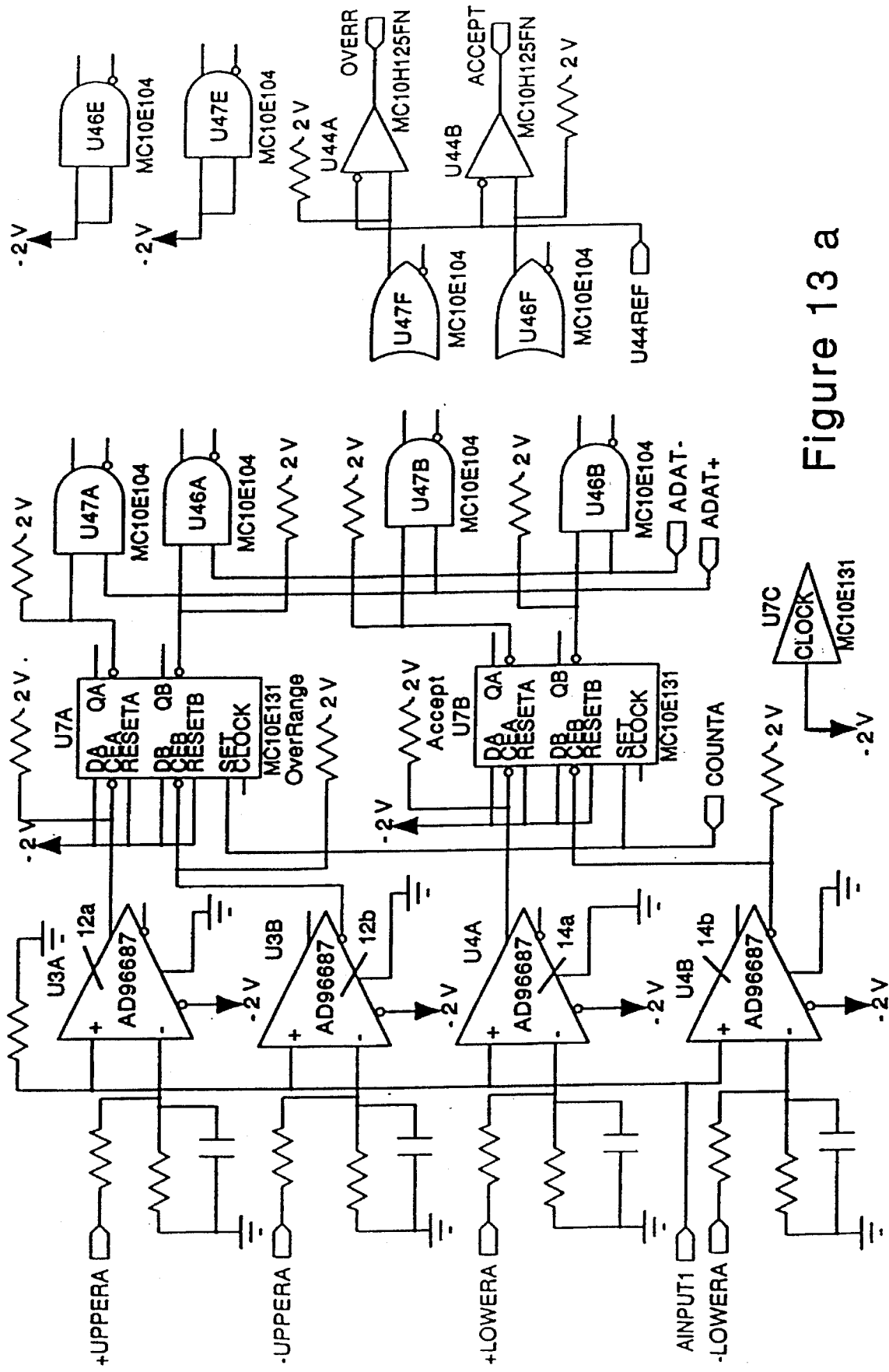
FIGS. 13a and 13b is a schematic diagram illustrating the pulse height analyzer means.
Figure 13B:
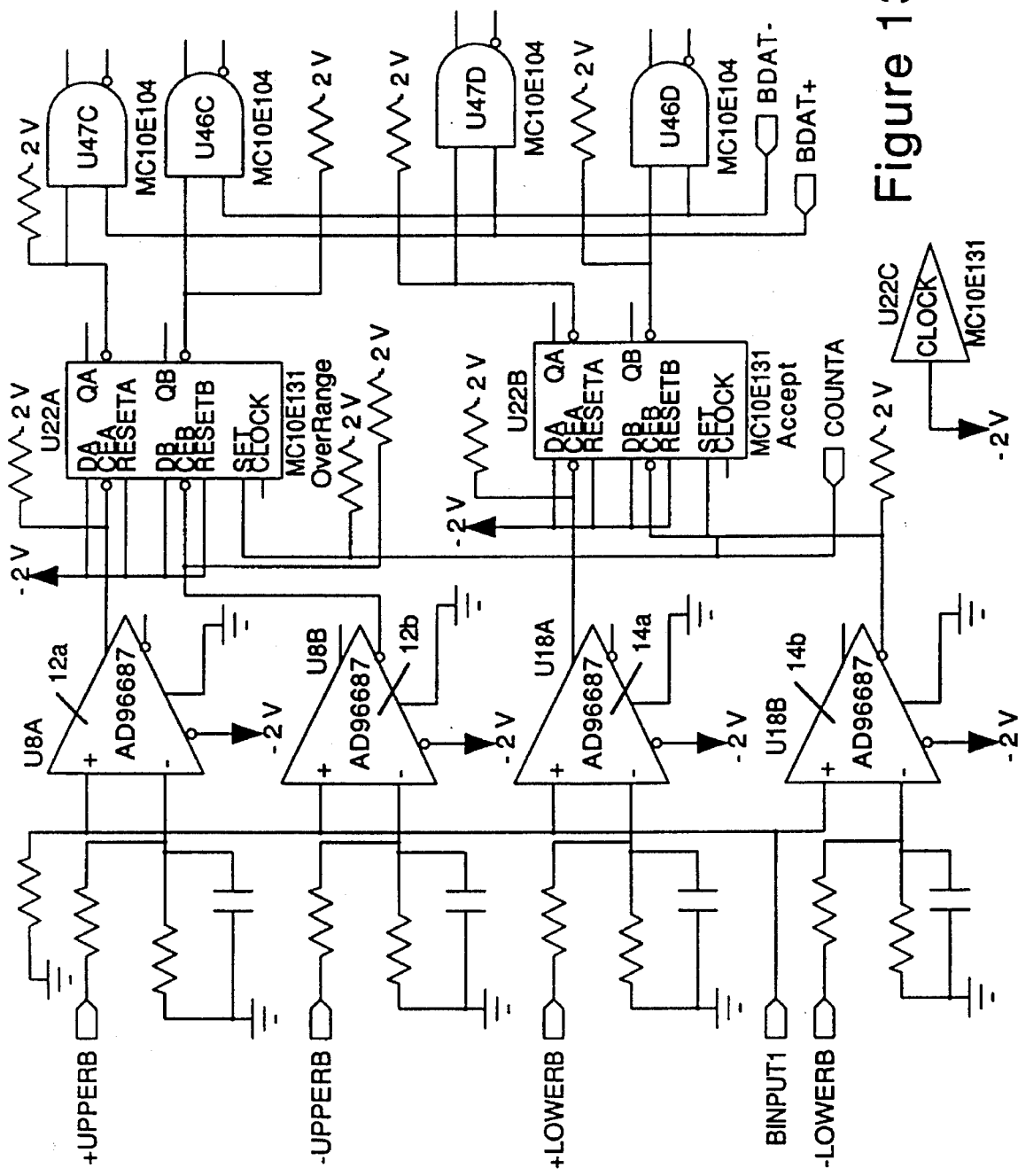
Figure 14A:
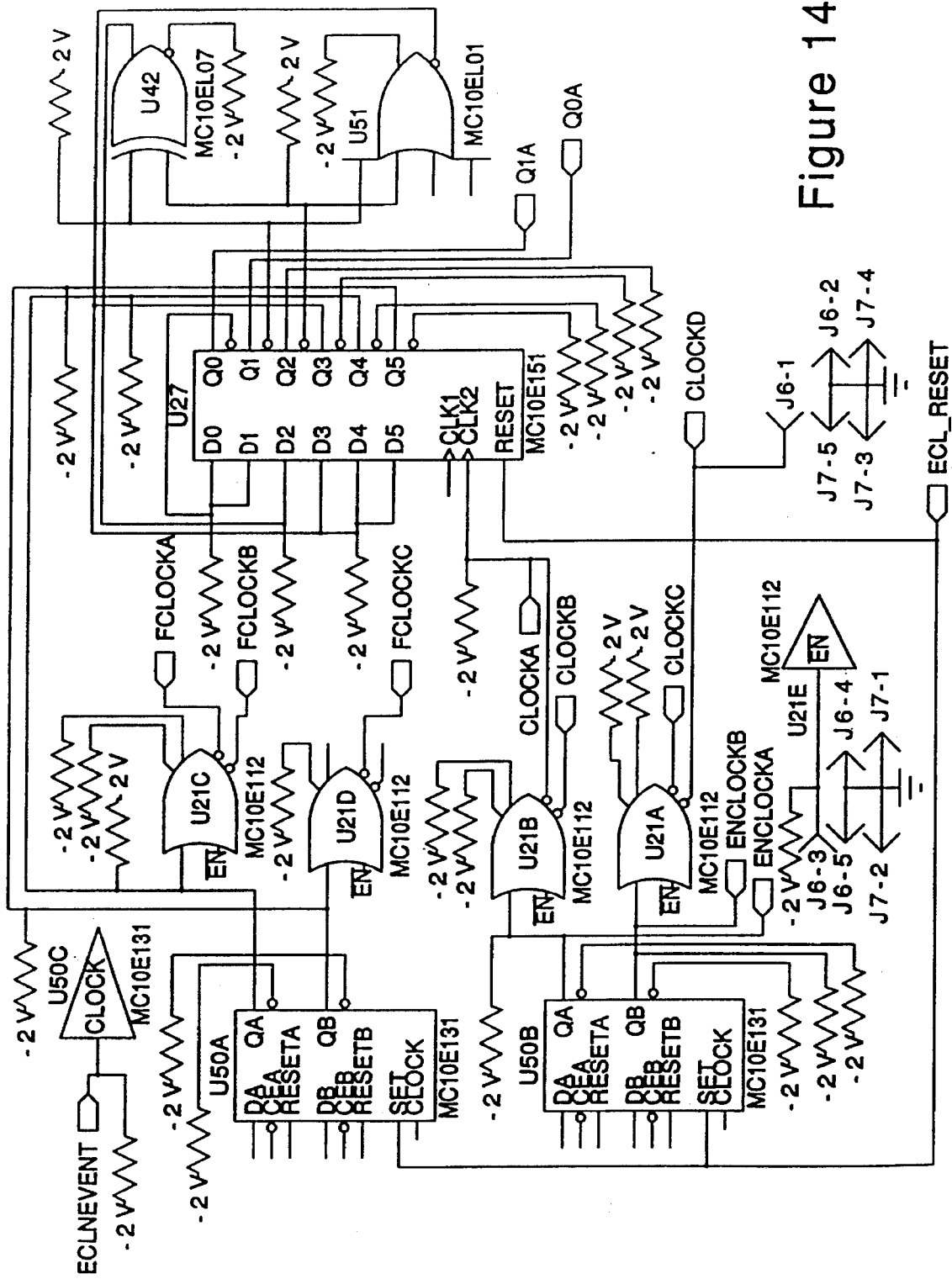
FIGS. 14a and 14b is a schematic diagram illustrating event timing circuitry.
Figure 14B:
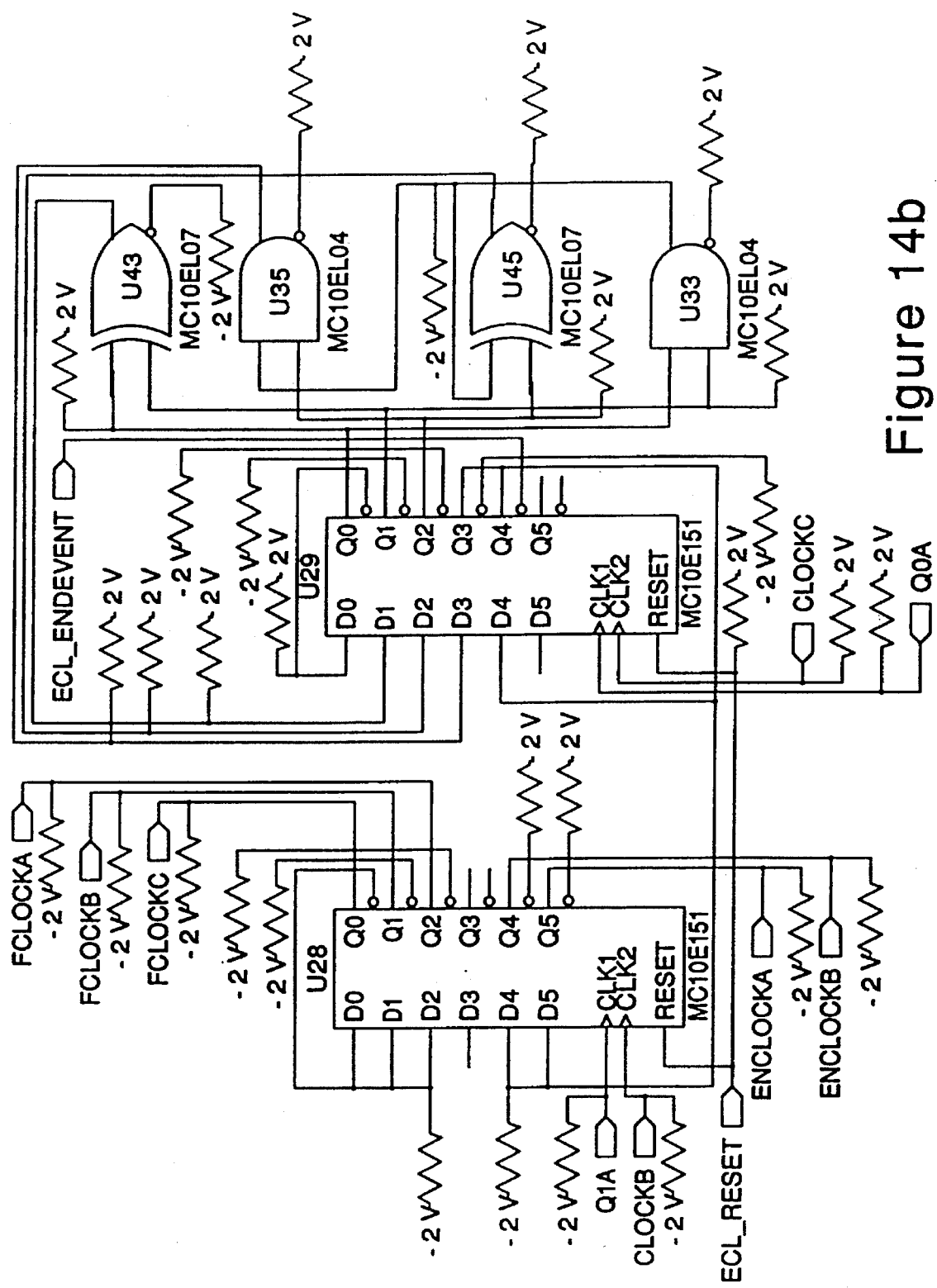

With each pulse between the upper and lower voltage thresholds, the contents of the counter corresponding to one of these pulse categories is increased by one. After a selected period of time, for example one power frequency ac cycle or a portion thereof, the number of pulses recorded in each pulse counter can be read by the computer 2 in a conventional fashion and stored. This information can be used to create a pulse profile of the stator for review by maintenance personnel, and corrective action can be taken if partial discharge is indicated. Examples of the types of graphic displays which can be used to convey information to the user are illustrated in FIGS. 5 and 6.

In a preferred mode of operation of the device, the selected voltage range is varied in stepped increments throughout the sampling process. A single ac cycle (for example 60 Hz, or one cycle each 16.6 ms) is divided into, for example, 100 intervals of equal length (166 µs per interval). In each interval, the controller 2 samples the pulse height analyzer means through a series of selected voltage ranges. Thus, the computer is programmed to set the upper and lower voltage limits at, for example, 40 and 20 mV, respectively, and in the first interval samples the pulse height analyzer means for pulses having a peak magnitude within this range, as described above. The controller 2 then resets the reference levels of the comparators 12, 14 to 60 and 40 mV, respectively, and samples the pulse height analyzer means again. The controller 2 continually resets the selected voltage range (a 20 mV range is given by way of example only) so that the upper voltage limit of the previous sample becomes the lower voltage limit of the current sample interval, until the upper voltage limit is approximately 4 V, which reflects the maximum magnitude of any partial discharge pulse. This stepped sampling process, which can involve hundreds of samples per sample interval, is repeated during each selected sample interval within the ac cycle. The controller 2 produces from the resulting sample data a three dimensional plot of the pulse count rate rs. phase angle vs. pulse magnitude, an example of which is illustrated in FIG. 5. Preferably, the controller 2 also produces a two dimensional plot of pulse count rate versus pulse magnitude, an example of which is illustrated in FIG. 6.

A preferred embodiment of the invention is described above, with reference to the Stator Slot Coupler described in U.S. Pat. No. 4,949,001 as the preferred sensor providing a two-channel output to the device of the invention. Using a sensor with a single output will considerably reduce the number of components and the amount of memory required by the invention, although the analysis will not provide information concerning the general location of partial discharge. The invention can also be practiced without recording "wide" pulses, which are for research interest only and can for most practical purposes be grouped with noise pulses. The invention would in either case be capable of distinguishing between partial discharge and noise pulses based on the pulse width of the detected pulse, and of determining the magnitude of each pulse using a conventional "flash" analog-to-digital converter, and as such these embodiments are contemplated within the scope of the invention.

FIGS. 7 through 14 are schematic diagrams illustrating a preferred embodiment of the circuitry employed in the invention. Except as expressly specified herein, the invention is not restricted to the specific circuitry illustrated.

The invention having been thus described with reference to a preferred embodiment, it will be apparent to those skilled in the art that certain modifications and adaptations may be made without departing from the scope of the invention, as set out in the appended claims.

We claim:

1. A device for distinguishing between partial discharge and electrical noise received by a sensor, comprising a sensor input for connection to the sensor, pulse height analyzer means connected to the sensor input for determining whether an amplitude of a pulse detected by the sensor is within a preselected range of voltages, trigger means having an input connected to the sensor input and an input provided with a reference voltage that is lower than the range of voltages, for transmitting an output when the amplitude of the pulse detected by the sensor is above the reference voltage, a controller including a clock activated by a pulse having a voltage within the range of voltages, for sampling the output of the trigger means at a series of preselected intervals, first recording means for recording the output of the trigger means at the preselected intervals, second recording means for recording information from the first recording means when the pulse has an amplitude within the range of voltages, means for decoding the information stored in the second recording means including programmable means programmed with parameters defining pulse types corresponding to predetermined parameters for partial discharge pulses and noise pulses, and means for recording the occurrence of pulses of the defined pulse types.

2. The device of claim 1 wherein second recording means comprises a slow shift register.

3. The device of claim 1 wherein first recording means comprises a fast shift reg/ister.

4. The device of claim 1 wherein the pulse height analyzer means comprises a pair of comparators referenced to upper and lower voltage levels defining the preselected range of voltages for a pulse of a particular polarity.

5. The device of claim 1 including means for determining a polarity of a detected pulse and pulse height analyzer means, trigger means and first recording means for each of positive and negative polarities.

6. The device of claim 1 wherein information from the first recording means is transferred to the second recording means only when a detected pulse is within the range of voltages.

7. The device of claim 1 wherein the output of the trigger means is sampled at a series of four equal intervals and then a series of four longer intervals.

8. The device of claim 7 wherein the output of the trigger means is sampled at 0, 2, 4, 6, 8, 16, 24, 32 and 40 ns following the detection of a pulse at the trigger means.

9. The device of claim 1 wherein the controller resets the range of voltages after a preselected interval to sample a plurality of ranges of voltages over a selected portion of an ac cycle.

10. The device of claim 1 including two sensor inputs, two pulse height analyzer means, two trigger means and two first recording means for each polarity, whereby the device can be connected to each channel of a partial discharge sensor having two outputs.

11. The device of claim 10 wherein a first bit in the first recording means is recorded as high for the channel corresponding to the output of the sensor at which a detected pulse first arrives, and a first bit of the first recording means for the other channel, corresponding to the other output of the sensor, remains low.

12. The device of claim 1 wherein means for decoding the information stored in the second recording means comprises a programmable logic device.

13. A device for distinguishing between partial discharge and electrical noise received by a sensor having two outputs for transmitting a signal proportional to an amplitude of a pulse received by the sensor, the sensor being directional such that the location of the pulse relative to the sensor determines the timing of transmission of the signal from each sensor output, comprising a sensor input for connection to each output of the sensor, pulse height analyzer means connected to at least one sensor input for determining whether an amplitude of a pulse detected by the sensor is within a preselected range of voltages, for each sensor input, trigger means having an input connected to the sensor input and an input provided with a reference voltage that is lower than the range of voltages, for transmitting an output when the amplitude of the pulse detected by the sensor is above the reference voltage, clock means activated by a pulse having a voltage within the range of voltages, for sampling the output of the trigger means at a series of preselected intervals, for each sensor input, a fast shift register for recording the output of the trigger means at the preselected intervals, for each sensor input, a slow shift register for receiving information from the fast shift register where the pulse has an amplitude within the range of voltages, means for decoding the information stored in the slow shift registers including programmable means programmed with parameters defining pulse types corresponding to predetermined parameters for partial discharge pulses and noise pulses, and means for recording each occurrence of pulses of the pulse types.

14. The device of claim 13 wherein the pulse height analyzer means comprises a pair of comparators referenced to upper and lower voltages defining the preselected range of voltages.

15. The device of claim 13 wherein the trigger means comprises a comparator.

16. The device of claim 13 wherein means for decoding the information stored in the slow shift registers comprises a programmable logic device.

17. The device of claim 13 wherein means for recording each occurrence of pulses of the pulse types comprises a separate pulse counter for each pulse type.

* * * * *